(12) United States Patent
Tiwari et al.

(10) Patent No.: US 9,024,670 B2
(45) Date of Patent: May 5, 2015

(54) SYSTEM AND METHOD FOR CONTROLLING CIRCUIT INPUT-OUTPUT TIMING

(71) Applicant: Texas Instruments Incorporated, Dallas, TX (US)

(72) Inventors: Ashutosh Tiwari, Bilaspur (IN); Ish Kumar Dham, Shankarnagar Bangalore (IN); Pranav Murthy, Bangalore (IN); Virendra Brijlal Bansal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/048,238

(22) Filed: Oct. 8, 2013

(65) Prior Publication Data

US 2015/0097608 A1    Apr. 9, 2015

(51) Int. Cl.
*H03H 11/26* (2006.01)
*H03K 5/159* (2006.01)

(52) U.S. Cl.
CPC ........................................ *H03K 5/159* (2013.01)

(58) Field of Classification Search
USPC ......... 327/142, 143, 198, 261–264, 269, 270, 327/276–278
See application file for complete search history.

(56) References Cited

U.S. PATENT DOCUMENTS

| | | | |
|---|---|---|---|
| 6,222,406 B1 * | 4/2001 | Noda et al. | 327/269 |
| 6,727,740 B2 * | 4/2004 | Kirsch | 327/161 |
| 7,772,911 B2 * | 8/2010 | Ide et al. | 327/291 |
| 8,188,781 B1 * | 5/2012 | Lee | 327/264 |
| 2004/0155690 A1 * | 8/2004 | Andrews et al. | 327/276 |
| 2005/0134351 A1 * | 6/2005 | Tamura | 327/278 |

* cited by examiner

*Primary Examiner* — Brandon S Cole
(74) *Attorney, Agent, or Firm* — Robert D. Marshall, Jr.; Frank D. Cimino

(57) ABSTRACT

An integrated circuit (IC) includes a plurality of input/output (I/O) terminals through which signals pass into or out of the IC and an I/O timing module. The I/O timing module is configured to add propagation delay to signals passing between the I/O terminals and I/O subsystems of the IC. The I/O timing module includes a plurality of delay elements associated with each of the I/O terminals, a control register associated with each of the I/O terminals, a memory, and I/O delay control logic. The control register is coupled to each of the delay elements associated with the I/O terminal. The memory is encoded with delay information. The I/O delay control logic is configured to initialize the propagation delay associated with each of the I/O terminals by selecting which of the delay elements are to be applied to produce the propagation delay based on the delay information stored in the memory.

16 Claims, 3 Drawing Sheets

SYSTEM AND METHOD FOR CONTROLLING CIRCUIT INPUT-OUTPUT TIMING

BACKGROUND

The process of modifying an integrated circuit (IC) to meet pre-established timing requirements is referred to as "timing closure." Timing closure can be a challenging task for IC designs because the timing margins shift with changes to process/environment parameters (i.e., process corners). As a result, an optimal implementation for one process corner can fail to meet the timing requirements at another process corner. Numerous place and route and/or other design process iterations may be required to produce a design that meets the pre-established timing requirements (e.g., setup and hold times) for the IC across process corners. Accordingly, timing closure can result in an objectionable increase in the time and cost associated with designing an IC.

SUMMARY

A system and method for optimizing timing closure by controlling the propagation delay of signals routed to input/output (I/O) terminals of an integrated circuit (IC) are disclosed herein. In one embodiment, an IC includes a plurality of I/O terminals through which signals pass into or out of the IC and an I/O timing module. The I/O timing module is configured to add propagation delay to signals passing between the I/O terminals and I/O subsystems of the IC. The I/O timing module includes a plurality of delay elements associated with each of the I/O terminals, a control register associated with each of the I/O terminals, a memory, and I/O delay control logic. The control register is coupled to each of the delay elements associated with the I/O terminal. The memory is encoded with delay information. The I/O delay control logic is configured to initialize the propagation delay associated with each of the I/O terminals by selecting which of the delay elements are to be applied to produce the propagation delay based on the delay information stored in the memory.

In another embodiment, a method includes routing signals passing to or from I/O terminals of an IC through an I/O timing module of the IC. Propagation delay is added to the signals in the I/O timing module. Delay elements of the I/O timing module are selected, by the I/O timing module, to apply to each signal and provide the propagation delay based on an identity of the signal and delay information stored in the I/O timing module for the signal.

In a further embodiment, an IC includes I/O terminals and an I/O timing module. The I/O terminals are configured to pass signals into or out of the IC. The I/O timing module is configured to add propagation delay to the signals, and includes a plurality of arrays of delay elements, propagation delay value storage, a calibration controller, and a delay controller. One of the arrays of delay elements corresponds to each of the I/O terminals. The propagation delay value storage stores a propagation delay value for each of the signals. The calibration controller is configured to measure the propagation delay provided by the delay elements. The delay controller is configured to select, for each of the signals, based on the measured propagation delay of the delay elements, which of the delay elements to apply to provide the propagation delay specified by the propagation delay value.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
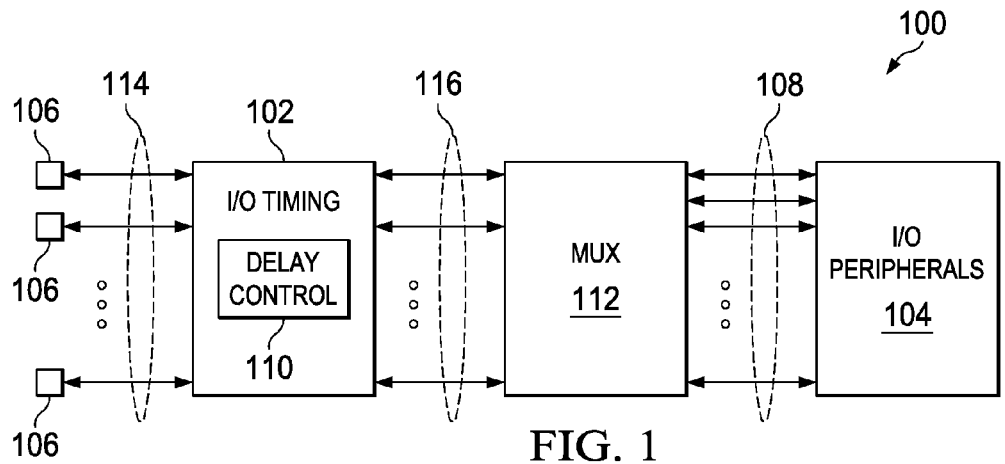
FIG. 1 shows a block diagram of an integrated circuit (IC) including input/output (I/O) terminal propagation delay control in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections. The recitation "based on" is intended to mean "based at least in part on." Therefore, if X is based on Y, X may be based on Y and any number of additional factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Ensuring that circuitry associated with the input/output (I/O) terminals of an integrated circuit (IC) meets predetermined timing requirements is a substantial part of the process of timing closure for the IC. While similar ICs may include similar peripheral devices, timing closure for I/O signals associated with the peripheral devices conventionally requires time consuming iterative static timing analysis using different parameters and adjustment of circuit placement and routing. Furthermore, conventional timing closure processes are strained when multiplexing signals to/from an I/O terminal using I/O pin/signal selection because additional effort is required to ensure that each signal meets I/O timing requirements.

Embodiments of the integrated circuits disclosed herein include I/O timing circuitry that simplifies the process of timing closure with regard to signals routed to/from I/O terminals of an IC. Accordingly, embodiments reduce the cost and time associated with designing an IC. The I/O timing circuitry disclosed herein provides programmable delay to I/O signals, thereby allowing the timing of I/O signals to be controlled without the substantial iterative timing analysis and place and route needed with conventional ICs. Embodiments of the I/O timing circuitry measure the delay provided by delay elements of the I/O timing circuitry under operational conditions, and adaptively apply the delay elements to provide a preprogrammed propagation delay to each I/O signal as needed for the signal to meet the pre-established timing requirements of the IC.

FIG. 1 shows a block diagram of an IC 100 including I/O terminal propagation delay control in accordance with various embodiments. The IC 100 includes a plurality of I/O terminals 106, an I/O timing control module 102, an I/O signal multiplexer 112, and I/O peripherals 104. The IC 100 may also include other circuitry and systems that have been omitted from FIG. 1 in the interest of clarity. The I/O terminals 106 are signal transfer structures through which the circuitry of the IC 100 is coupled to circuitry external to the IC 100. The I/O terminals 106 may include conductive pins, pads, etc.

The I/O peripherals 104 are subsystems that include various devices that drive signals to or receive signals from one or more of the I/O terminals 106. Examples of device that may be included in the I/O peripherals include general purpose I/O logic, universal asynchronous/synchronous receive/transmit logic, serial peripheral interface logic, inter-IC (I²C) logic, timers, audio ports, network adapters, memory controllers, video controllers, etc. Signals 108 are routed between the I/O peripherals 104 and the multiplexer 112.

The multiplexer 112 provides selectable routing of signals between the I/O terminals 112 and the I/O peripherals 104. For example, the multiplexer 112 may allow one of sixteen different signals 108 generated by the I/O peripherals 104 to be selectably routed to each I/O terminal 106. Similarly, the multiplexer 112 may allow one of sixteen different I/O terminals 106 to be connected to an input of an I/O peripheral 104. Signals may be selected for routing to/from the I/O terminals 106 during operation of the IC 100. The number of signals that can be selectably routed between each of the I/O terminals 106 and outputs of the I/O peripherals, and/or between the I/O terminals 106 and each input of the I/O peripherals 104 may vary in different embodiments of multiplexer 112. Signals 116 are routed between the multiplexer 112 and the I/O timing control module 102.

The I/O timing control module 102 controls the propagation delay of signals 114 routed to/from the I/O terminals 106 through the I/O timing control module 102 from/to the I/O peripherals 104. The I/O timing control module 102 includes a delay controller 110. The delay controller 110 determines how a predetermined amount of propagation delay specific to each I/O signal passing through the I/O timing control module 102 is to be generated and applied. By applying an appropriate propagation delay to each I/O signal the I/O timing control module 102 simplifies timing closure with respect to signals routed to/from the I/O terminals 106.

In some embodiments of the IC 100, at least some of the peripheral devices of the I/O peripherals 104 may be included in a "hardened" circuitry component in conjunction with the I/O timing control module 102, and the multiplexer 112. In such embodiments, the routing between the peripheral devices and the I/O timing control module 102 is fixed, simplifying the determination of propagation delays applied by the I/O timing control module 102, and further simplifying the process of timing closure with respect to the signals routed between the I/O terminals 106 and the peripheral devices. Some peripheral devices of the I/O peripherals 104, e.g., complex peripheral devices, such as memory controllers, video controllers, etc. may be located outside such a hardened component. The I/O timing control module 102 also simplifies timing closure with respect to such peripherals.

Figure 2:
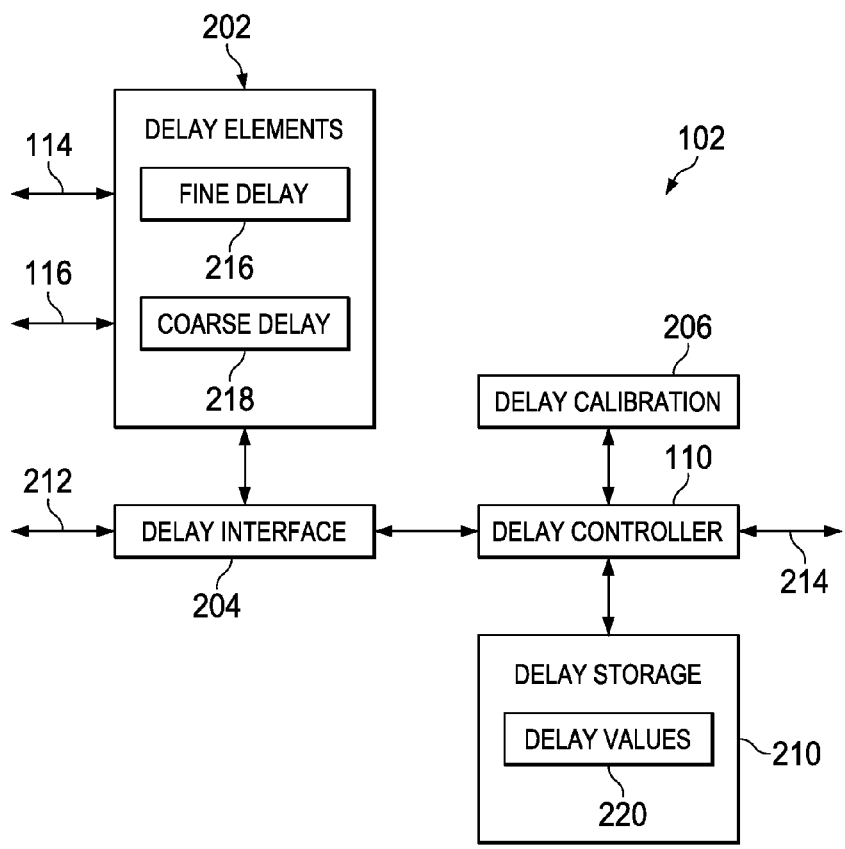
FIG. 2 shows a block diagram of an I/O timing control module that controls timing at IC I/O terminals in accordance with various embodiments.

FIG. 2 shows a block diagram of the I/O timing control module 102. The I/O timing control module 102 includes a plurality of delay elements 202, a delay interface 204, delay calibration logic 206, the delay controller 110, and delay storage 210. The delay storage 210 includes a storage device (e.g., a non-volatile memory such as FLASH storage, read-only-memory storage, etc.). Delay values 220 are stored in the delay storage 210. The delay values 220 specify the propagation delay to be applied to each I/O signal that can pass through the I/O timing control module 102 to/from an I/O terminal 106. The delay values 220 may be determined during design of the IC 100 by analysis of delays across various corners. The delay storage 210 may include storage location sufficient to store a number of delay values equivalent to the number of I/O terminals 106 times the number of signals routable to each I/O terminal 106 via the multiplexer 112.

The delay elements 202 include a set of delay elements or delay lines corresponding to each of the I/O terminals 106. The signals 114 associated with the I/O terminals 106, and the signals 116 associated with the multiplexer 112, are connected to the delay elements 202 for insertion of propagation delay. The delay elements 202 are selectable and/or programmable to obtain a propagation delay in accordance with each of the delay values stored in the delay storage 210. The set of delay elements 202 associated with each I/O terminal 106 includes coarse delay elements 218 and fine delay elements 216. Each of the coarse delay elements 218 provides a substantially longer delay than each of the fine delay elements 216. For example, a coarse delay element may provide about 1 nanosecond of delay, and fine delay element may provide less than 100 picoseconds of delay. In some embodiments, the set of delay elements 202 corresponding to an I/O terminal 106 may include 22 coarse delay elements 218 and 22 fine delay elements 216. Other embodiments may include a different number of fine and/or coarse delay elements per I/O terminal 106.

The delay calibration controller 206 measures the delay provided by the coarse delay elements 218 and the delay provided by the fine delay elements 216 during operation of the IC 100. The delay controller 110 applies the measured coarse and fine delay values to determine how the delay elements 202 should be applied to achieve a propagation delay value for a given I/O signal as specified by a delay value 220 retrieved from the delay storage 210. Thus, the calibration controller 206 allows the delay controller 110 to account for changes in propagation delay of the delay elements 202 caused by environmental conditions, such as process, temperature, and/or voltage.

The delay controller 110 controls the delay elements 202 via the delay interface 204. The delay interface 204 includes logic (e.g., a control register corresponding to each I/O terminal 106) that generates control signals for selecting which of the coarse and fine delay elements 218, 216 are to be applied to generate a given signal propagation delay. For example, the delay interface 204 may include a control register coupled to each delay element 202, and that provides signals for selecting which of delay elements 202 is to be used to effectuate a needed propagation delay. The delay interface 204 also provides an interface to a bus 212 that allows circuitry external to the I/O timing control module 102 to select which of the delay elements 202 are applied to delay an I/O signal, and to communicate with the delay controller 110. Thus, via the delay interface 204, external circuitry can override or adjust propagation delay values set by the delay controller 110, and initiate various functions of the I/O timing control module 102.

The delay controller 110 can change the propagation delay associated with an I/O terminal 106 based a change in the signal routed to the I/O terminal 106. The signals 214 notify the delay controller 110 of changes in the identity, source, and/or destination of signals passing through the I/O timing control module 102. Changes in signal identity, source, and/or destination may be effectuated via the multiplexer 112. When the delay controller 110 is notified of such a signal change, via the signals 214, the delay controller 112 can retrieve a delay value for the new signal from the delay storage 210, determine how the delay elements 202 are to be applied to effectuate the retrieved delay value, and select the appropriate delay elements to effectuate the propagation delay via the delay interface 204. Thus, the I/O timing control module 102 can vary the propagation delay applied in conjunction with an I/O terminal 106 in association with runtime changes in the identity of the signal routed to the I/O terminal 106.

Figure 3:
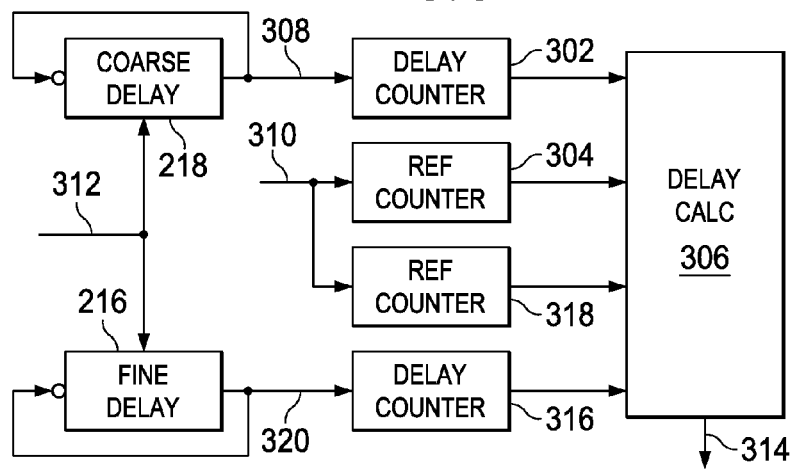
FIG. 3 shows a block diagram of a delay calibration controller that measures delays of delay elements applied to control timing at IC I/O terminals in accordance with various embodiments.

FIG. 3 shows a block diagram of the delay calibration controller 206. The delay calibration controller 206 measure delays of delay elements 202 applied to control timing at I/O terminals 106. The delay calibration controller 206 includes delay counters 302 and 316, reference counters 304 and 318, and delay calculation logic 306. The delay calibration controller 206 measures the delay of both coarse and fine delay elements 218, 216.

To measure the delay provided by the coarse delay elements 218, the calibration logic 206, or the delay controller 110 to facilitate delay measurement, selects a predetermined number of coarse delay elements (e.g., 88 elements), arranged in series. The selected set of coarse delay elements 218 is arranged as a ring oscillator, and the oscillation output 308 of the ring oscillator is connected to the delay counter 302.

The reference counter 304 is incremented by a reference clock signal 310 of known frequency. The count outputs of the delay counter 302 and the reference counter 304 are provided the delay calculation logic 306. The delay calculation logic 306 can enable counting by the delay counter 302 and the reference counter 304 at a given time (e.g., a same time) to initiate delay measurement, and disable counting by both counters 302, 304 at a later time (e.g., when either counter 302, 304 reaches a maximum count value, a predetermined count value, etc.).

Based on the known period of the reference clock 310 and the ratio of the final count values of the delay and reference counters 302, 304, the delay calculation logic 306 determines the period of the ring oscillator output 308 and the total delay provided by the serially arranged coarse delay elements 218. The delay calculation logic 306 divides the total delay by the number of coarse delay elements 218 in the ring oscillator to determine the delay provided by each individual coarse delay element 218 under operating conditions. The delay calculation logic 314 provides the measured delay to the delay controller 110 for use in determining which of the delay elements 202 is to be applied to effectuate a propagation delay. The measured coarse delay per element (CDPE) may be calculated as:

$$CDPE = \frac{(RefCnt * RefClkPeriod)}{(2 * CrsDlyCnt * NumCrsElements)}$$

where:
RefCnt is the final count value of the reference counter 304;
RefClkPeriod is the known period of the reference clock signal 310;
CrsDlyCnt is the final count value of the delay counter 302; and
NumCrsElements is the number coarse delay elements in the coarse delay ring oscillator.

The delay calibration controller 206 measures the delay of fine delay elements 216 in a manner similar to that described with regard to the coarse delay elements 218. When measuring the delay of the fine delay elements 216, a number of fine delay elements 216 that is substantially larger than number of coarse delay elements 218 applied in coarse element calibration may be used. For example, 264 fine delay elements may be sequentially arranged to form a ring oscillator generating oscillation signal 320. The reference counter 318 and the delay counter 316 are incremented by reference clock 310 and fine delay ring oscillator output clock 320 respectively until halted by the delay calculation logic 306. The final count values of the counters 316, 318 are used to compute the measured fine delay per element (FDPE) as:

$$FDPE = \frac{(RefCnt * RefClkPeriod)}{(2 * FineDlyCnt * NumFineElements)}$$

where:
RefCnt is the final count value of the reference counter 318;
RefClkPeriod is the period of the reference clock signal 310;
FineDlyCnt is the final count value of the delay counter 316; and
NumFineElements is the number fine delay elements in the fine delay ring oscillator.

The delay calibration logic 206 may be triggered to measure the delays provided by the elements 216, 218 at device initialization (e.g., power on reset time). In some embodiments of the I/O timing control module 102, the delay calibration logic 206 may be triggered via the signals 214 to initiate delay measurement. For example, execution of software instructions may trigger recalibration based on an identified change in operating conditions, such as voltage or temperature.

Figure 4:
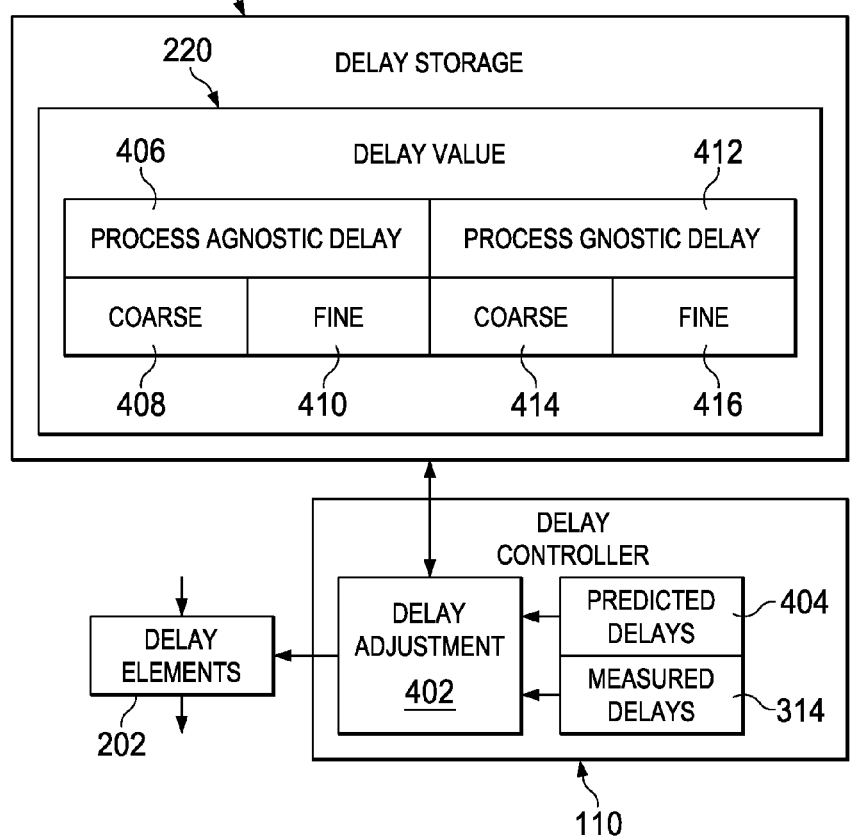
FIG. 4 shows a block diagram of a delay controller that sets timing for IC I/O terminals in accordance with various embodiments.

FIG. 4 shows a block diagram of the delay controller 110. The delay controller 110 includes delay adjustment logic 402 that determines which of the set of delay elements 202 corresponding to an I/O terminal 106 to apply to an I/O signal to provide a propagation delay specified by a delay value 220 retrieved from delay storage 210. The delay adjustment logic 402 applies the measured delays 314 provided by the delay calibration controller 206, and predicted/expected delay values 404, which may be delay values predicted by design for the coarse and fine delay elements 218, 216, to determine which delay elements 202 should be applied to generate the propagation delay specified by the delay value 220.

Because the interconnect and other delays on different paths (e.g., clock and data paths) can vary differently across operating conditions, application of a fixed propagation delay via the delay elements 202 may result in timing violations for some process/temperature/voltage combinations. Embodiments of the I/O timing control module 102 overcome this difficulty by specifying propagation delay in two parts: process invariant (agnostic) delay and process variant (gnostic) delay.

The delay value 220 retrieved from delay storage 210 includes a process agnostic delay value 406 and a process gnostic delay value 412 that conjunctively specify the propagation delay for a corresponding I/O signal I/O terminal combination. The process gnostic delay value 412 specifies a portion of the delay value 220 that scales from max corner to min corner of the IC 100 in the same manner as other circuitry of the IC 100. The process gnostic delay value 412 includes a coarse delay value 414 and a fine delay value 416. The coarse delay value 414 and fine delay value 416 may respectively specify a number coarse delay elements 218 and a number of fine delay elements 216.

The process agnostic delay value 406 specifies a portion of the delay value 220 that remains the same across corners of the IC 100, i.e., delay that fixed with respect to process and operating conditions. The process agnostic delay value 406 also includes a coarse delay value 408 and a fine delay value 410. The coarse delay value 408 and fine delay value 410 may respectively specify a number coarse delay elements 218 and a number of fine delay elements 216. However, the delay specified by values 408, 410 is process invariant, and consequently does not change with operational conditions.

The delay controller 110 may compute the total coarse delay (CrsDly) to be applied to a given I/O terminal for a given I/O signal as:

CrsDly=ACrsDly*PredCrsDly+GCrsDly*CDPE where:
ACrsDly is a number of process agnostic coarse delay elements (e.g. coarse value 408);
PredCrsDly is predicted or expected delay (404) of a coarse delay element;
GCrsDly is a number of gnostic coarse delay elements (e.g. coarse value 414); and
CDPE is measured delay (314) per coarse delay element.

Having computed the total coarse delay (CrsDly), the delay adjustment logic 402 determines the number of coarse delay elements 218 to apply as CrsElements=CrsDly/CDPE.

Similarly, the delay adjustment logic 402 computes the total fine delay as:

FineDly=AFineDly*PredFineDly+GFineDly*FDPE where:
AFineDly is a number of process agnostic fine delay elements (e.g. fine value 410);
PredFineDly is predicted or expected delay (404) of a fine delay element;
GFineDly is a number of process gnostic fine delay elements (e.g. fine value 416); and
FDPE is measured delay (314) per fine delay element.

The delay adjustment logic 402 computes the number of fine delay elements 218 to apply in conjunction with CrsElements as:

FineElements=FineDly/FDPE.

The total delay implemented by the delay adjustment logic 402 for the delay value 220 is:

TotalDly=CrsDly+FineDly, where the process agnostic portion of the specified delay does not vary with process, operating conditions, etc. because the number of delay elements applied to provide the process agnostic delay varies based on the measured coarse and fine delay values 314. Thus, embodiments account for process invariant delays, such as metal delays, and account for process variant delays, such as component delays.

Figure 5:
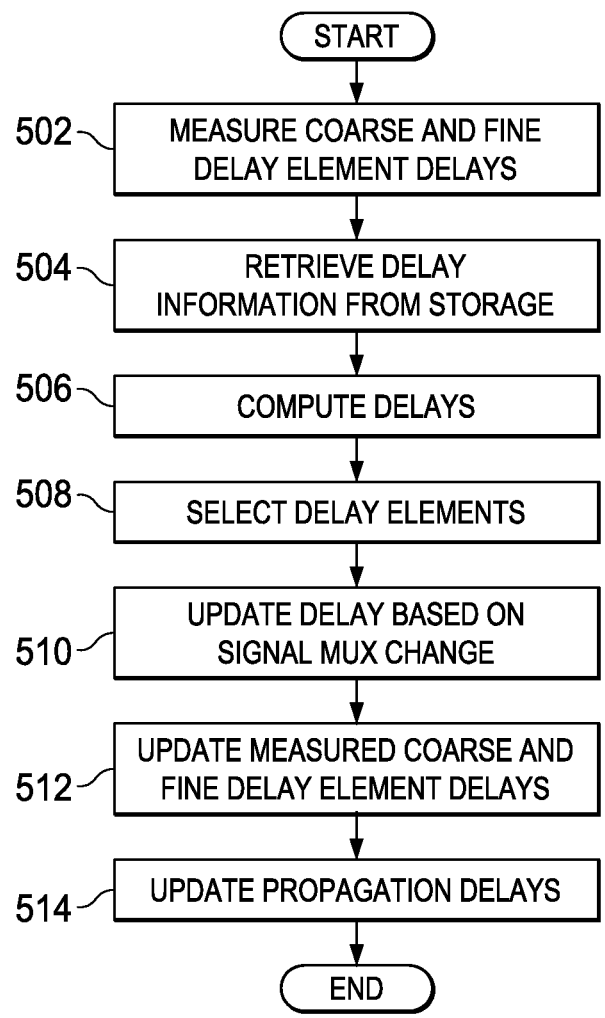
FIG. 5 shows a flow diagram for a method for controlling propagation delay associated with IC I/O terminals in accordance with various embodiments.

FIG. 5 shows a flow diagram for a method for controlling propagation delay associated with IC I/O terminals 106 in accordance with various embodiments. Though depicted sequentially as a matter of convenience, at least some of the actions shown can be performed in a different order and/or performed in parallel. Additionally, some embodiments may perform only some of the actions shown.

In block 502, the IC 100 is initialized. For example, the IC 100 may be performing operations associated with a power on reset. The delay calibration controller 206 measures the delays of the coarse delay elements 218 and the fine delay elements 216 under operating conditions during the initialization of the IC.

In block 504, the delay controller 110 accesses the delay storage 210 and retrieves from the delay storage 210 delay values 220. The delay values 220 specify the propagation delay to be applied to signal routing for each of the I/O terminals 106. Each of the delay values 220 specifies, for a signal routed to an I/O terminal 106, process invariant and process variant portions of the propagation delay for both coarse delay elements 218 and fine delay elements 216.

In block 506, the delay controller 110 computes the total coarse delay and the total fine delay to be applied to each signal routed to an I/O terminal 106. For a given signal, the total coarse delay is the sum of the coarse process invariant delay and the coarse process variant delay computed for the signal. The total fine delay is the sum of the fine process invariant delay and the fine process variant delay computed for the signal. The process invariant delays are computed as a product of a nominal or planned coarse/fine delay element delay value and the number of coarse/fine delay elements specified in the coarse/fine process invariant portion of the delay value 220. The process variant delays are computed as a product of a measured coarse/fine delay element delay value and the number of coarse/fine delay elements specified in the coarse/fine process variant portion of the delay value 220.

In block 508, the delay controller 110 selects which of the coarse delay elements 218 and which of the fine delay elements 216 are to be applied to provide the propagation delay specified by the delay value 220 for routing to an I/O terminal 106. The delay controller 110 may identify a number of coarse delay elements 218 to be applied based on the computed total coarse delay and the measured delay of a coarse delay element 218. The delay controller 110 may identify a number of fine delay elements 216 to be applied based on the computed total fine delay and the measured delay of a fine delay element 216. The delay controller 110 writes information specifying the number of coarse delay elements 218 and the number of fine delay elements 216 to be applied to a control register that provides selection signals to the delay elements 202 corresponding to the I/O terminal 106. For example, one selection signal may be provided to each delay element 202.

In block 510, the delay controller 110 receives an indication of a change in signal routing to an I/O terminal 510. For example, the signal routed to the I/O terminal 106 may be changed via the multiplexer 112. The indication may result from assertion of a signal 214 by circuitry external to the I/O timing control module 102. In response to the indication of a change in signal routing, the delay controller 110 retrieves, from the delay storage 210, a delay value 220 corresponding to the new signal. The delay controller 110 computes delays for the delay value 220 as described for block 506, and selects delay elements to implement the delay as described for block 508.

In block 512, the delay calibration controller 206 is triggered to measure the delays of the coarse delay elements 218 and the fine delay elements 216. The triggering may result from assertion of a signal 214 by circuitry external to the I/O timing control module 102. In response to the triggering, the delay calibration controller 206 measures the delays of the coarse delay elements 218 and the fine delay elements 216 as described for block 502.

In block 514, the delay controller 110 is triggered to retrieve delay values 220 from the delay storage 210 and update the propagation delays implemented for I/O terminals 106. The triggering may result from assertion of a signal 214 by circuitry external to the I/O timing control module 102. In response to the triggering, the delay controller 110 performs the operations described for blocks 504-508.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit (IC), comprising:
    a plurality of input/output (I/O) terminals through which signals pass into or out of the IC; and
    an I/O timing module configured to add propagation delay to signals passing between the I/O terminals and I/O subsystems of the IC, the I/O timing module comprising:
        a plurality of delay elements associated with each of the I/O terminals;
        a control register associated with each of the I/O terminals and coupled to each of the delay elements associated with the I/O terminal, each control register storing selection data for selecting delay elements of the associated I/O terminal;
        a non-volatile memory encoded with delay information for each I/O terminal; and
        I/O delay control logic configured to initialize the propagation delay associated with each of the I/O terminals by
            retrieving corresponding delay information from the non-volatile memory,
            determining which of the delay elements to enable in combination to produce the propagation delay, and
            writing data to the associated control register for selecting which of the delay elements are to be applied to produce the determined propagation delay.

2. The IC of claim 1, wherein:
    the plurality of delay elements comprise:
        a plurality of coarse delay elements; and
        a plurality of fine delay elements;
        wherein the fine delay elements are configured to provide smaller delay than the coarse delay elements; and
    the I/O timing module further comprises delay calibration logic configured to
        measure a first delay value for each of the coarse delay elements by connecting a predetermined number of coarse delay elements in series in a coarse ring oscillator and measuring a period of the coarse ring oscillator, and
        measure a second delay value for each of the fine delay elements by connecting the predetermined number of fine delay elements in series in a fine ring oscillator and measuring a period of the fine ring oscillator.

3. The IC of claim 1, wherein the I/O timing module comprises an I/O multiplexer configured to selectably route one of a plurality of signals to an I/O terminal; and wherein the I/O delay control logic is configured to change the propagation delay associated with the I/O terminal responsive to the I/O multiplexer changing which of the signals is routed to the I/O terminal, and based on the signal to be routed to the I/O terminal.

4. The IC of claim 1, wherein the I/O timing module comprises a delay control interface configured to allow circuitry external to the I/O timing module to set the propagation delay associated with each of the I/O terminals by writing a delay information value to the control register associated with each of the I/O terminals.

5. The IC of claim 1, wherein:
    the delay information comprises a process gnostic coarse delay value whose value scales with process in the same manner as other circuitry of the IC, a process gnostic fine delay value whose value scales with process in the same manner as other circuitry of the IC, a process agnostic coarse delay value whose value is process independent, and a process agnostic fine delay value whose value is process independent.

6. The IC of claim 5, wherein the I/O delay control logic is configured to compute the propagation delay, for an I/O terminal, as a sum of:
    a product of the process agnostic coarse delay value and a predicted delay value of a coarse delay element;
    a product of the process agnostic fine delay value and a predicted delay value of a fine delay element;
    a product of the process gnostic coarse delay value and a measured delay value of a coarse delay element; and
    a product of the process gnostic fine delay value and a measured delay value of a fine delay element.

7. A method, comprising:
    routing signals passing to or from input/output (I/O) terminals of an integrated circuit (IC) through an I/O timing module of the IC;
    measuring a delay value for delay elements by connecting a predetermined number of delay elements in series in a ring oscillator and measuring a period of the ring oscillator; and
    selecting, by the I/O timing module, delay elements of the I/O timing module to apply to each signal and provide the propagation delay based on an identity of the signal and delay information stored in the I/O timing module for the signal.

8. The method of claim 7, wherein the selecting comprising determining a number of fine delay elements and a number of coarse delay elements to combine to produce the propagation delay; wherein the fine delay elements provide smaller delay than the coarse delay elements.

9. The method of claim 7, further comprising:
    changing, in the I/O delay module, after initialization of propagation delay associated with one of the I/O terminals, identity of the signal routed to one of the I/O terminals; and
    changing, by the I/O delay module, the propagation delay associated with the I/O terminal responsive to the changing of the identity of the signal, and based on the changed identity of the signal.

10. The method of claim 7, further comprising:
    presenting, by circuitry external to the I/O timing module, to the I/O delay module:
        a delay information value; and
        an I/O terminal identifier; and
    setting, by the I/O delay module, the propagation delay associated with the identified I/O terminal by writing the delay information value to a control register associated with the identified I/O terminal from circuitry external to the I/O timing module.

11. The method of claim 7, wherein the delay information comprises a process gnostic coarse delay value whose value scales with process in the same manner as other circuitry of the IC, a process gnostic fine delay value whose value scales with process in the same manner as other circuitry of the IC, a process agnostic coarse delay value whose value is process independent, and a process agnostic fine delay value whose value is process independent.

12. The method of claim 11, further comprising computing, by the I/O timing module, the propagation delay as a sum of:
  a product of the process agnostic coarse delay value and a predicted delay value of a coarse delay element;
  a product of the process agnostic fine delay value and a predicted delay value of a fine delay element;
  a product of the process gnostic coarse delay value and a measured delay value of a coarse delay element; and
  a product of the process gnostic fine delay value and a measured delay value of a fine delay element.

13. An integrated circuit (IC), comprising:
  input/output (I/O) terminals configured to pass signals into or out of the IC;
  an I/O timing module configured to add propagation delay to the signals, and comprising:
    a plurality of arrays of delay elements, one of the arrays corresponding to each of the I/O terminals;
    propagation delay value storage that stores a propagation delay value for each of the signals;
    a calibration controller configured to measure the propagation delay provided by each of the delay elements, said calibration controller operable to
      connect a predetermined number of delay elements in series in a ring oscillator, and
      measuring a period of the ring oscillator; and
    a delay controller configured to select, for each of the signals, based on the measured propagation delay of the delay elements, which of the delay elements to apply to provide the propagation delay specified by the propagation delay value.

14. The IC of claim 13, wherein each of the arrays of delay elements comprises:
  a plurality of coarse delay elements; and
  a plurality of fine delay elements;
  wherein the fine delay elements are configured to provide smaller delay than the coarse delay elements; and
  wherein the calibration controller is configured to measure the propagation delay provided by the coarse delay elements and the propagation delay provided by the fine delay elements.

15. The IC of claim 14, wherein each of the propagation delay values comprises a process gnostic coarse delay value whose value scales with process in the same manner as other circuitry of the IC, a process gnostic fine delay value whose value scales with process in the same manner as other circuitry of the IC, a process agnostic coarse delay value whose value is process independent, and a process agnostic fine delay value; and the delay controller is configured to compute the propagation delay whose value is process independent, for a signal as a sum of:
  a product of the process agnostic coarse delay value and a predicted delay value of a coarse delay element;
  a product of the process agnostic fine delay value and a predicted delay value of a fine delay element;
  a product of the process gnostic coarse delay value and the measured delay of a coarse delay element; and
  a product of the process gnostic fine delay value and the measured delay of a fine delay element.

16. The IC of claim 15, further comprising an I/O multiplexer configured to selectably route one of a plurality of signals to each I/O terminal; and wherein the delay controller is configured to change the propagation delay associated with the I/O terminal responsive to the I/O multiplexer changing which of the signals is routed to the I/O terminal, and based on an identity of the signal to be routed to the I/O terminal.

* * * * *